(12) United States Patent
Tzolov et al.

(10) Patent No.: US 8,329,505 B2
(45) Date of Patent: Dec. 11, 2012

(54) METHOD FOR DEPOSITION OF CATHODES FOR POLYMER OPTOELECTRONIC DEVICES

(75) Inventors: Marian Tzolov, State College, PA (US); Stephen Swiontek, State College, PA (US)

(73) Assignee: Lock Haven University of Pennsylvania, Lock Haven, PA (US)

( * ) Notice: Subject to any disclaimer, the term of this patent is extended or adjusted under 35 U.S.C. 154(b) by 0 days.

(21) Appl. No.: 13/016,330

(22) Filed: Jan. 28, 2011

(65) Prior Publication Data

US 2011/0189801 A1    Aug. 4, 2011

Related U.S. Application Data

(60) Provisional application No. 61/299,532, filed on Jan. 29, 2010.

(51) Int. Cl.
*H01L 51/40* (2006.01)
(52) U.S. Cl. ............. 438/99; 438/678; 438/26; 438/64; 257/E51.018; 257/E51.027
(58) Field of Classification Search ............... 438/99, 438/678, 26, 64; 257/E51.018, E51.02, E51.027
See application file for complete search history.

(56) References Cited

U.S. PATENT DOCUMENTS

| | | | |
|---|---|---|---|
| 3,995,299 A | 11/1976 | Partridge | |
| 4,152,712 A | 5/1979 | Myers | |
| 5,948,552 A | 9/1999 | Antoniadis et al. | |
| 6,488,555 B2 | 12/2002 | Pichler et al. | |
| 6,538,375 B1 | 3/2003 | Duggal et al. | |
| 7,414,359 B2 | 8/2008 | Elliott et al. | |
| 7,504,655 B2 | 3/2009 | Parker et al. | |
| 7,511,423 B2 | 3/2009 | Noh et al. | |
| 7,733,008 B2 | 6/2010 | Ke et al. | |
| 2003/0153141 A1 | 8/2003 | Carter et al. | |
| 2003/0219923 A1 | 11/2003 | Nathan et al. | |
| 2005/0094394 A1 | 5/2005 | Padiyath et al. | |
| 2005/0151122 A1 | 7/2005 | Jiang et al. | |

(Continued)

FOREIGN PATENT DOCUMENTS

JP          11008074          1/1999

(Continued)

OTHER PUBLICATIONS

International Search Report for PCT/US2011/022956 dated Apr. 5, 2011 (Form PCT/ISA/2010).

(Continued)

*Primary Examiner* — Julia Slutsker
(74) *Attorney, Agent, or Firm* — Buchanan Ingersoll & Rooney PC

(57) ABSTRACT

Embodiments of the invention explore solution-based deposition of a cathode for an OLED structure. A typical embodiment of the invention may include a method performed according to the following steps: Glass substrates including deposited Indium Tin-Oxide (ITO) are prepared. The substrates are subjected to ultrasonic cleaning with deionized water and organic solvents. Features are etched into the ITO using high concentration HCl solution. A hole injecting layer is deposited by spin coater. The layer is annealed on a hot plate, then a polyphenylene vinylene (PPV) polymer is deposited by spin coater and annealed on a hot plate. Low work function cathode metal is then deposited in an electroless solution and annealed on a hot plate. The device is encapsulated.

20 Claims, 11 Drawing Sheets

Flow chart of the device preparation (side view).

U.S. PATENT DOCUMENTS

| | | | |
|---|---|---|---|
| 2008/0084158 | A1 | 4/2008 | Shao et al. |
| 2009/0174315 | A1 | 7/2009 | Furukawa et al. |
| 2010/0033082 | A1 | 2/2010 | Liu et al. |
| 2011/0042656 | A1* | 2/2011 | Burroughes et al. ............ 257/40 |

FOREIGN PATENT DOCUMENTS

| | | |
|---|---|---|
| JP | 2000091072 | 3/2000 |

OTHER PUBLICATIONS

Written Opinion of the International Searching Authority for PCT/US2011/022956 Apr. 5, 2011 (Form PCT/ISA/237).

Jeong et al., "Improved Stability of Organic Light-Emitting Diode with Aluminum Cathodes Prepared by Ion Beam Assisted Deposition" Science and Technology of Advanced Materials 6 (2005) 97 102.

Wu et al., "Electroless Surface Polymerization of Polyaniline Films on Aniline Primed ITO Electrodes: A Simple Method to Fabricate Good Modified Anodes for Polymeric Light Emitting Diodes" J. Mater. Chem. 2001, 11, pp. 2287-2292.

Duggal, "Roll-to-Roll OLEDs" SSL Manufacturing Workshop Apr. 21-22, 2009.

Bernards et al., "Organic Light Emitting Devices with Laminated Top Contacts" American Institute of Physics, Applied Physics Letters, May 3, 2004, vol. 84, No. 18, pp. 3675-3677.

Lochun et al., "Manufacturing Flexible Light Emitting Polymer Displays with Conductive Lithographic Film Technology".

Institute of Materials Research and Engineering, "OLED at IMRE".

Shiang, "Organic Light Emitting Devices for Lighting" The Electrochemical Society Interface, Winter 2009, pp. 37 41.

Redinger, "Solution Processing Techniques for Low-Cost Circuit Fabrication" Electrical Engineering and Computer Sciences, University of California at Berkeley, Technical Report No. UCB/EECS 2007 3, Jan. 5, 2007, pp. 1 157.

* cited by examiner

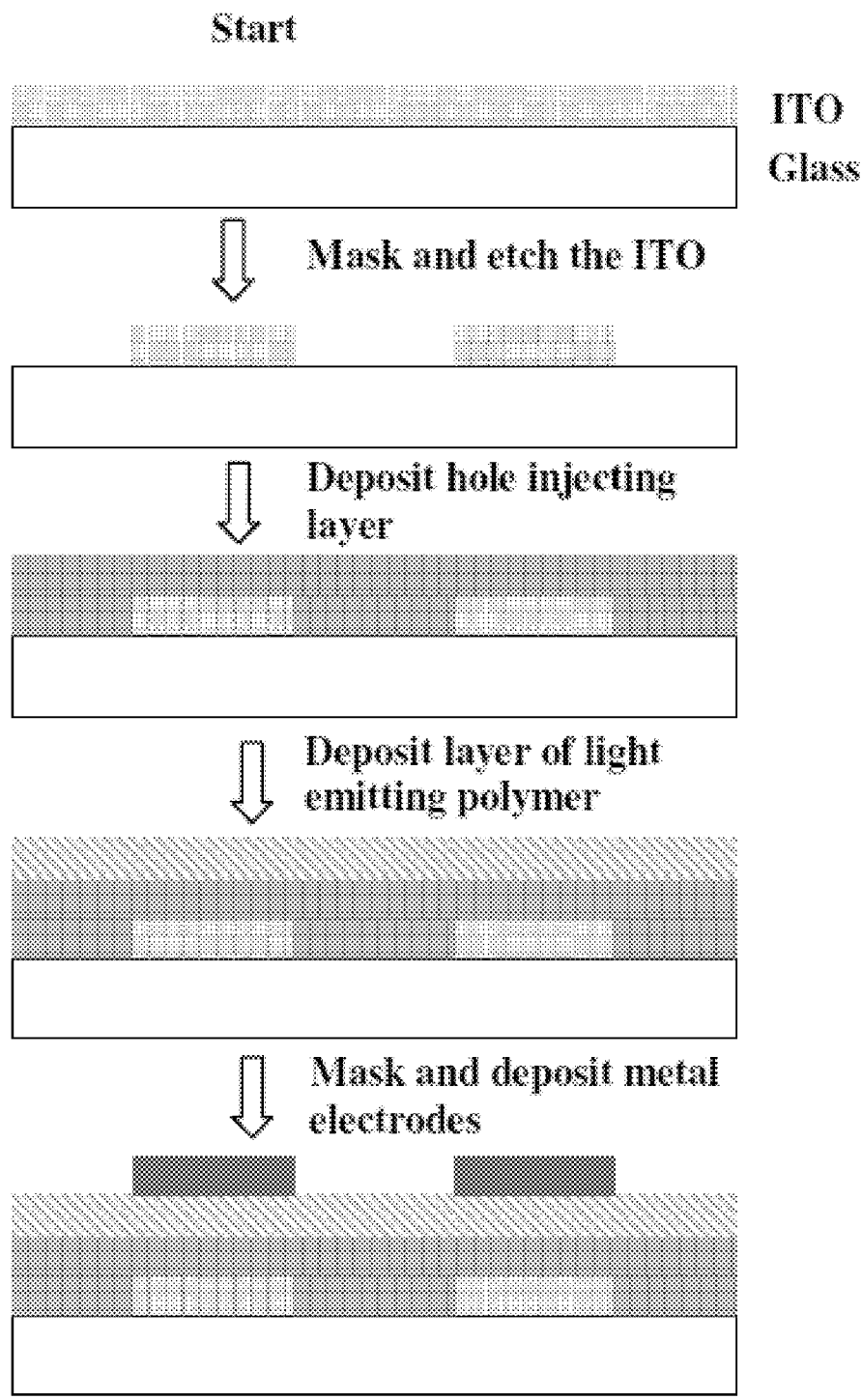
Figure 2. Flow chart of the device preparation (side view).

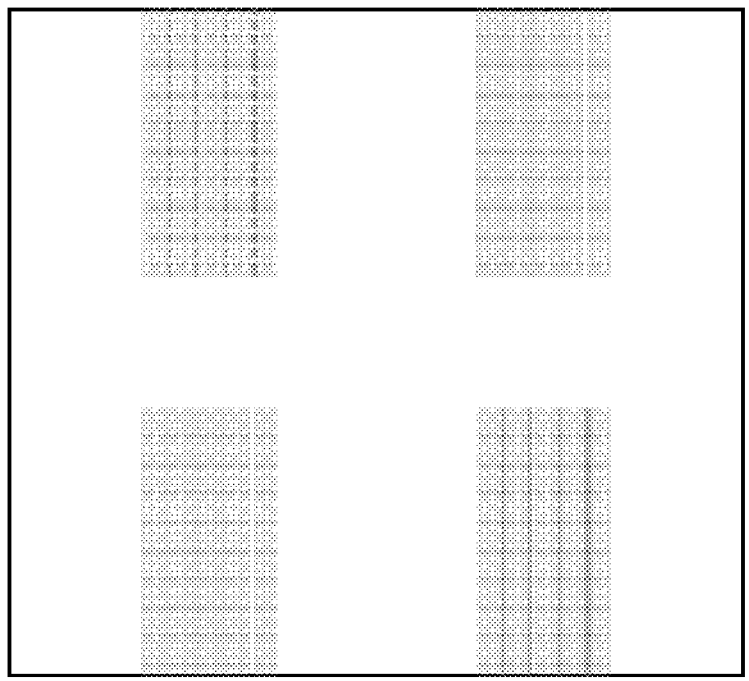
Figure 3. Schematics of a glass substrate with structured anode layer (top view).

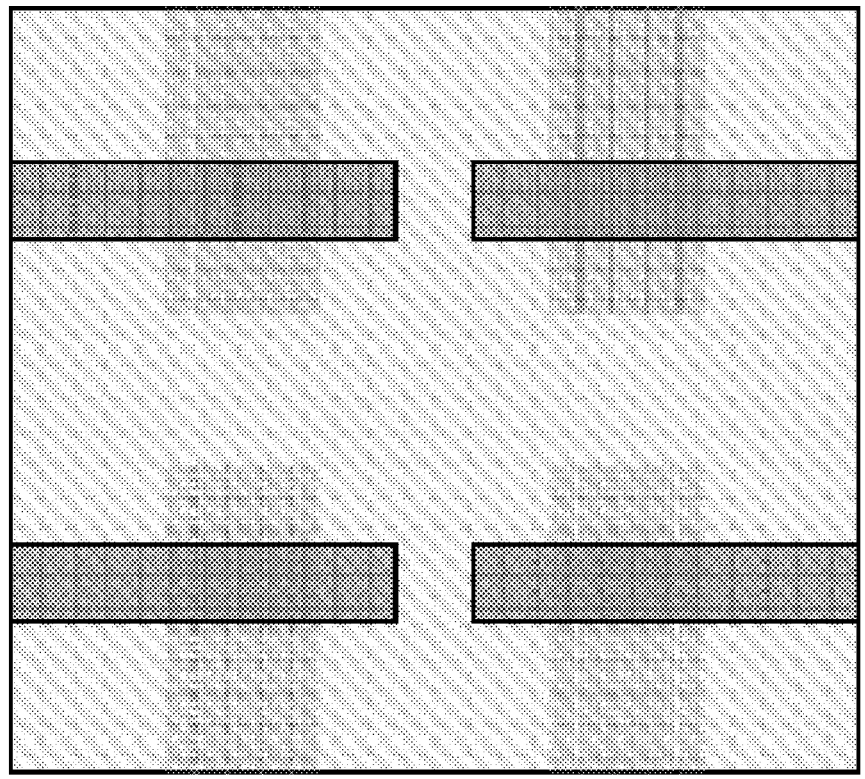
Figure 4. Schematics of a finalized device (top view).

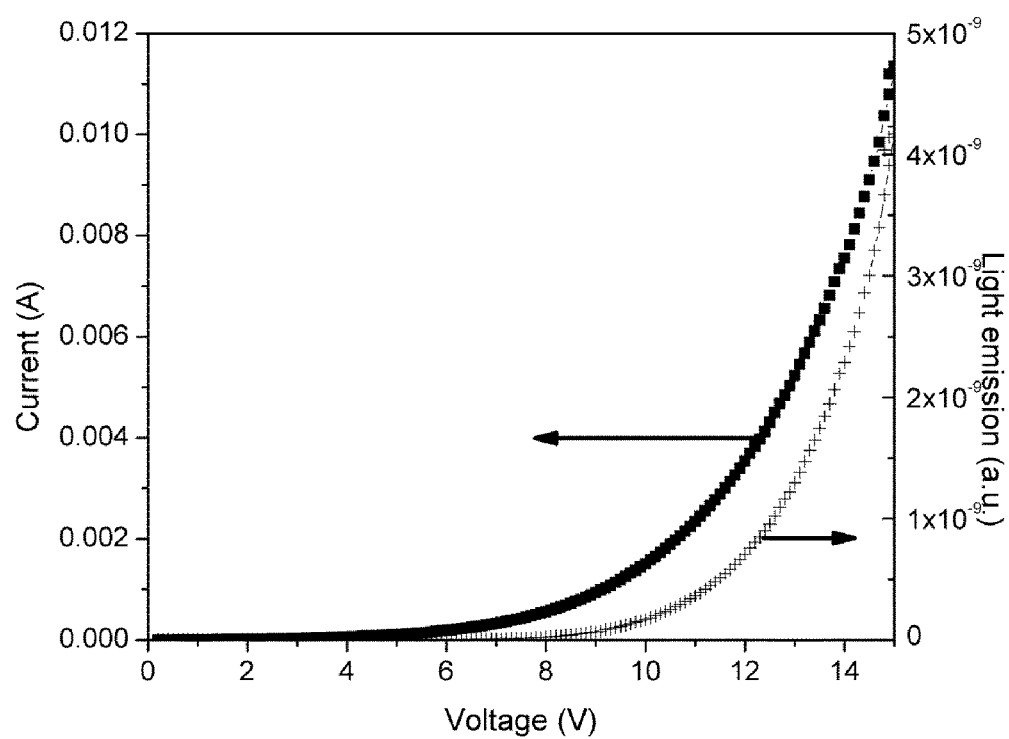
Figure 5. A typical current-voltage and light output-voltage characteristics of a light emitting device.

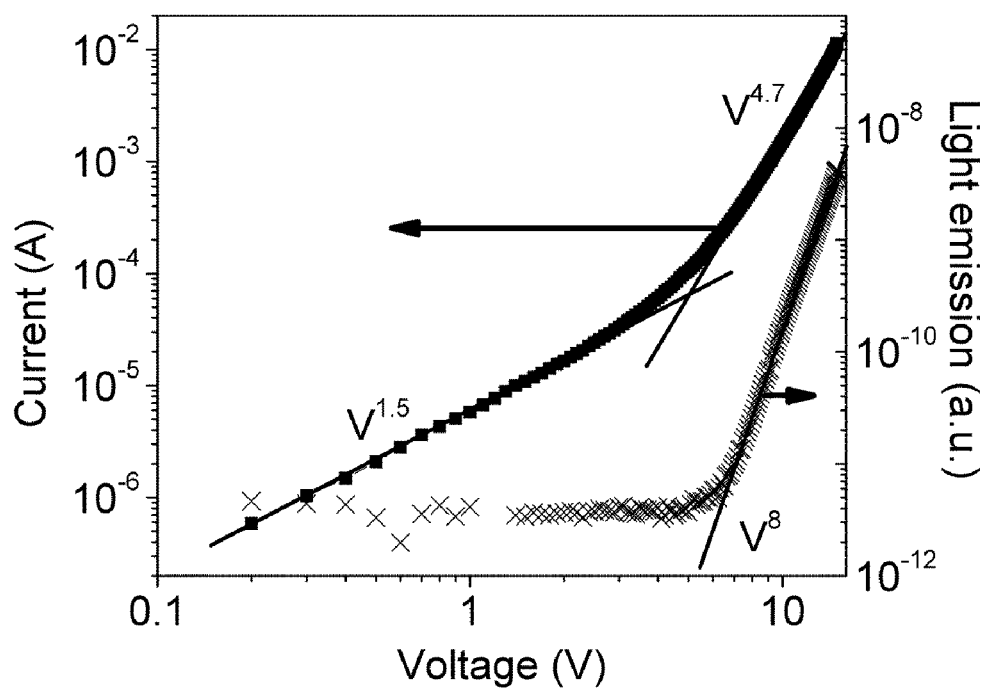
Figure 6. Double logarithmic plot of the current-voltage and light output-voltage characteristics from Figure 5.

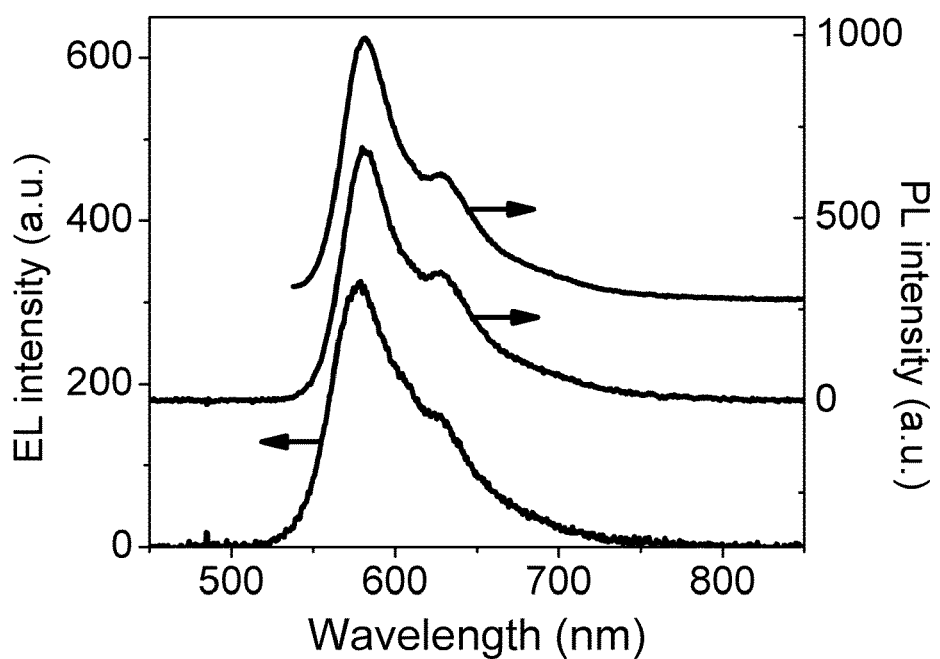
Figure 7. Comparison between the electroluminescence spectrum (bottom curve) and the photoluminescence spectra excited using light with wavelength 370 nm (middle curve) and 470 nm (top curve).

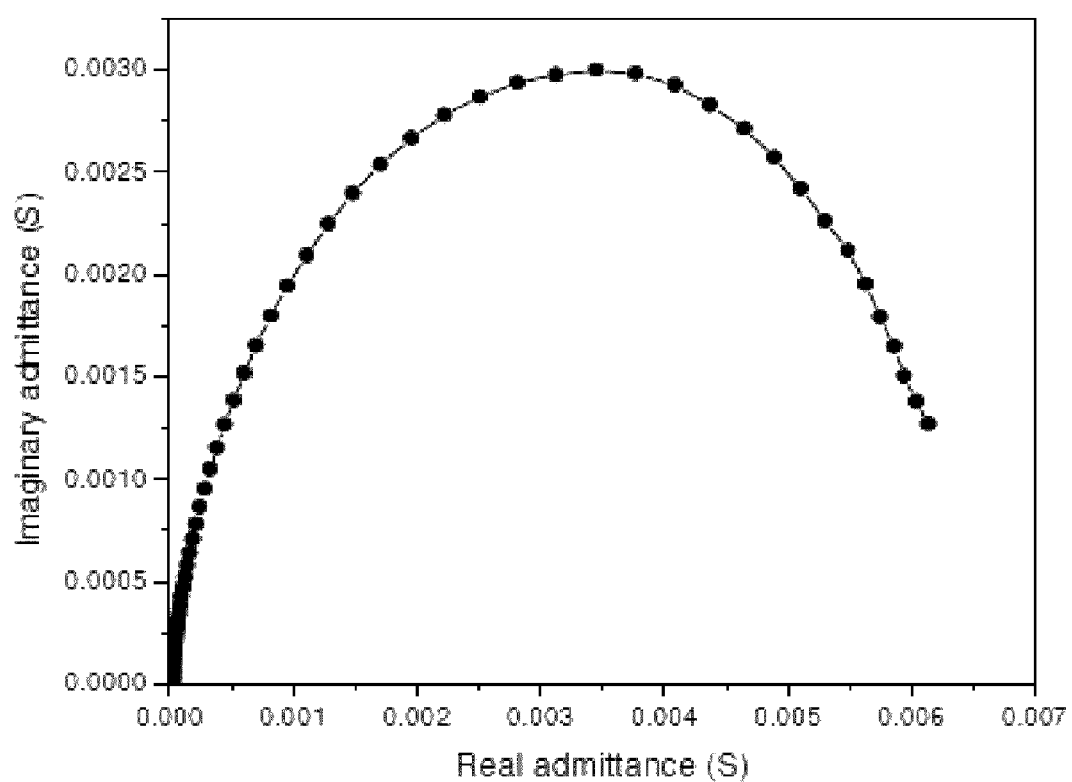
Figure 8. Admittance results for the device structure.

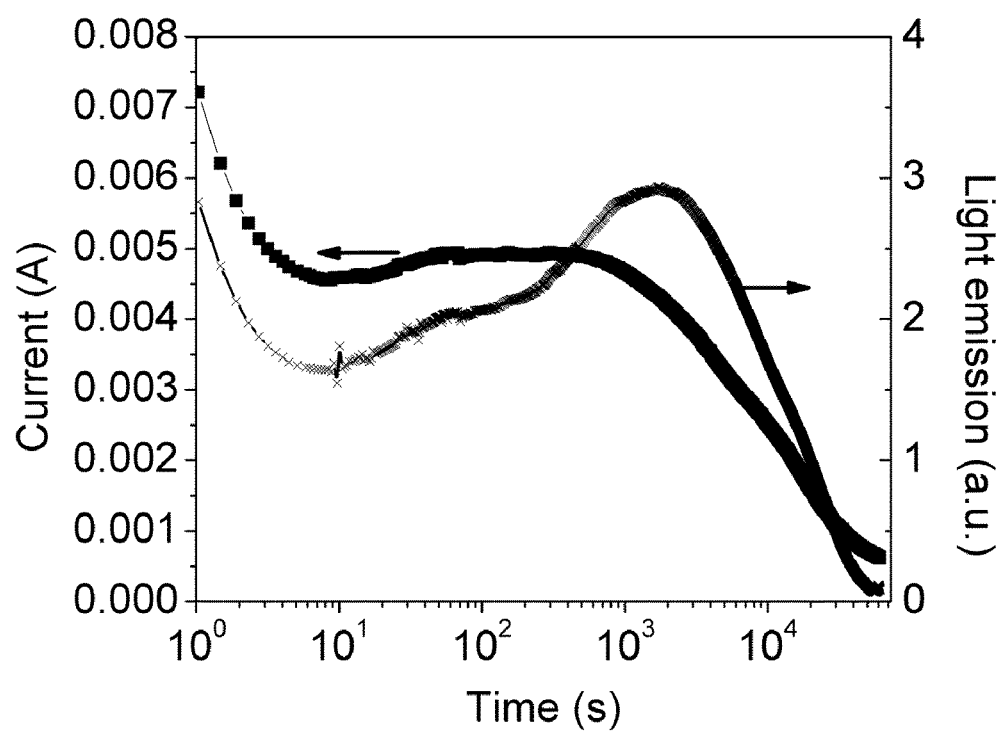
Figure 9. Stability measurements at constant voltage of 16 V.

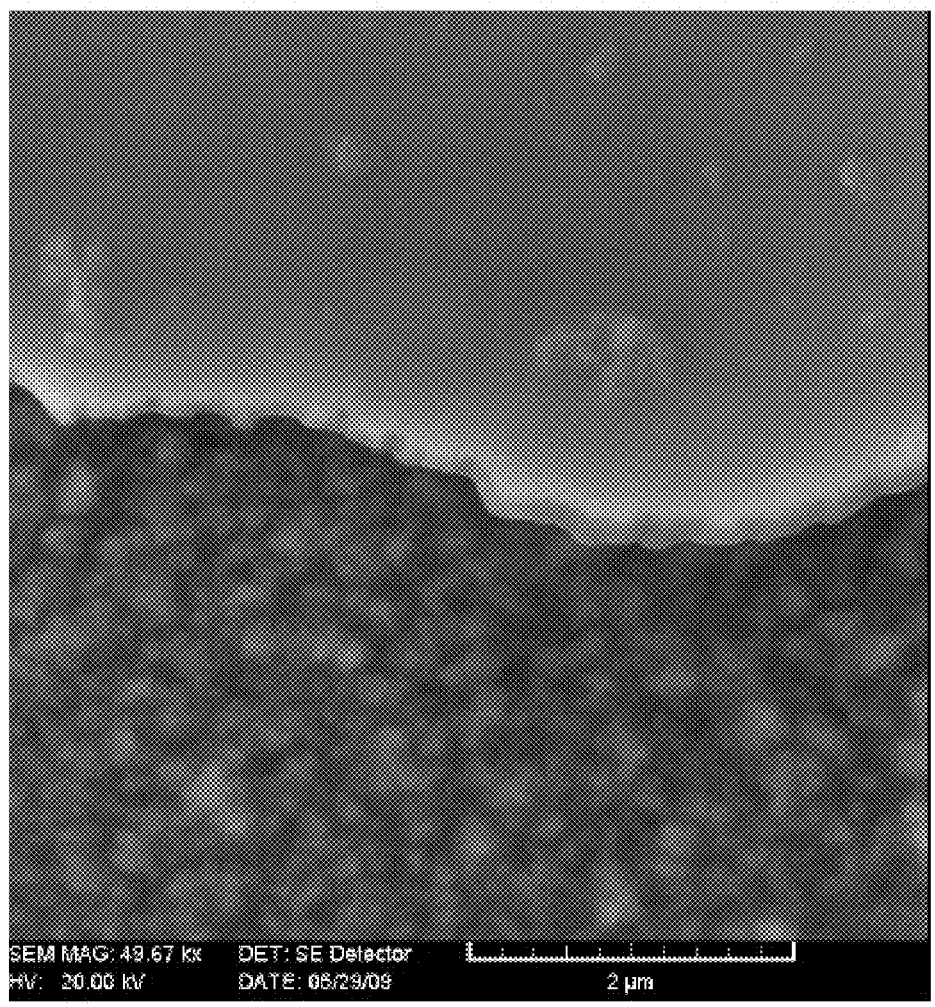
Figure 10. Scanning electron microscopy image of an electroless deposited silver film.

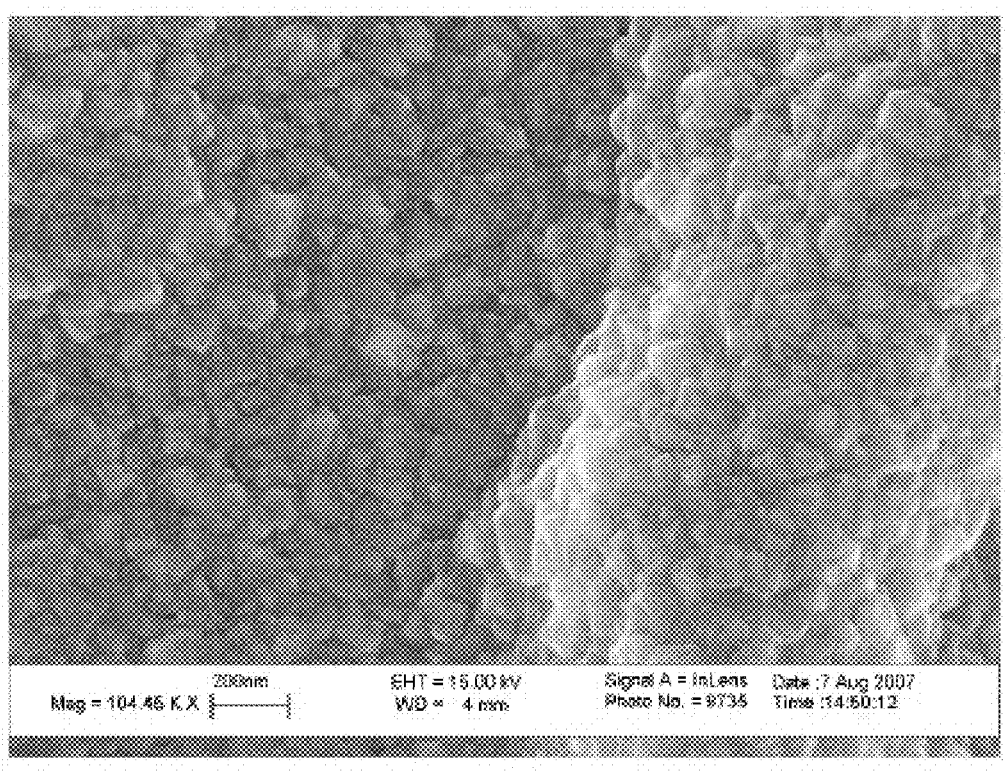
Figure 11. Scanning electron microscopy image of the top surface of an electroless deposited silver film.

METHOD FOR DEPOSITION OF CATHODES FOR POLYMER OPTOELECTRONIC DEVICES

CROSS-REFERENCE TO RELATED APPLICATIONS

This application claims priority to U.S. Provisional Patent Application No. 61/299,532, filed on Jan. 29, 2010. That application is incorporated by reference herein.

BACKGROUND OF THE INVENTION

1. Field of the Invention

Embodiments of the invention provide methods for creation of a solid state structure which emits light when current is passing through. The solid state structure is fabricated using solution-based processes. Fabricated structures are based on the polymer light emitting devices (PLEDs). An example of a PLED is shown in FIG. 1.

2. Description of the Related Art

"Electroluminescence" is light emitted by a solid through which an electric current is passing. This light is in addition to the normal thermal emission of the solid. Electroluminescence implies the presence of electronic excited states with populations larger than their thermal equilibrium value.

One electroluminescent device is an organic light emitting device, or OLED. Successful operation of an OLED has several prerequisites. These may be best illustrated by drawing a parallel with a common gas discharge bulb. The gas discharge bulb and the OLED have two contacts—anode and cathode—for applying an external voltage. In a gas bulb resulting electric field accelerates the electrons and ions in the gas discharge and they collide, transferring part of the kinetic energy into internal energy of the gas ions. The electrons in the gas ions are "lifted" in an excited state. They reside in this state for relatively short time and then they relax to a lower state by emitting a photon, which we utilize for illumination. Such impact ionization is unwanted in OLEDs, besides it is hard to achieve in a controllable manner.

In an OLED the electrodes are typically chosen such that the electrons in the anode are energetically close to the energy level where most of the electrons reside, i.e. the highest occupied molecular orbital (HOMO) or valence band. The cathode is typically chosen so that the electrons in it are energetically close to the first unoccupied energy level above the HOMO, i.e. the lowest unoccupied molecular orbital (LUMO) or conduction band.

If positive potential is applied to the anode and negative to the cathode in an OLED, the electrons from the cathode are injected in the polymer layer in its LUMO and electrons from the HOMO of the polymer are extracted into the anode. Effectively a positive charge, or a hole in the sea of electrons, is left at the position of the extracted electron, which is why the process is described as injection of holes from the anode into the polymer. The injected hole and electron drift into the polymer layer and when they meet the electron can recombine with the hole, or the system relaxes to the ground state, by emission of energy in the form of photons.

A critical step in the synthesis of OLEDs according to present methods is the deposition of the cathode. Typically the cathode is a metal layer, sometimes with a very thin buffer layer of elements from the first or second period of the Periodic Table. Deposition is usually done in vacuum systems by thermal evaporation or sputtering.

In other processes for creation of OLEDs, a conducting paste based on silver, nickel, carbon, and antimony-doped tin oxide particles is embedded in polymer matrix, which makes it suitable for screen printing of OLEDs or use in formulating inks for jet printing of OLEDs. Another approach is proposed by Lochun, et al. "Manufacturing flexible light-emitting polymer displays with conductive lithographic film technology." Smart Materials & Structures 10, 650-656 (2001). Lochun's lithographic approach is applied only to the anode, and the cathode is processed by traditional deposition using vacuum evaporation. Ocypa, et al. "Electroless silver deposition on polypyrrole and poly(3,4-ethylenedioxythiophene): The reaction/diffusion balance" J. Electroanalytical Chem. 596, 157-168 (2006), reported the electroless deposition of silver on top of polypyrrole and poly(3,4-ethylenedioxythiophene); however, no further device application is demonstrated, and there is no apparent motivation to provide a device. Krebs et al. "A complete process for production of flexible large area polymer solar cells entirely using screen printing-First public demonstration" *Solar Energy Materials and Solar Cells* 93, 422-441 (2009) and Zeng et al. "Polymer light-emitting diodes with cathodes printed from conducting Ag paste" *Advanced Materials* 19, 810 (2007), used screen printing of commercial silver paste to deposit silver films with significant thickness of several micrometers. The lamination process is another strategy for avoiding direct deposition of the metal film on top of the light emitting polymer.

BRIEF SUMMARY OF THE INVENTION

Embodiments of the invention explore solution-based deposition of a cathode on a structure like that shown in FIG. 1. A typical embodiment of the invention may include a method performed according to the following steps: Glass substrates including deposited Indium Tin-Oxide (ITO) are prepared. The substrates are subjected to ultrasonic cleaning with deionized ("DI") water and organic solvents. Features are etched into the ITO using high concentration HCl solution. A hole injecting layer is deposited by spin coater. The layer is annealed on a hot plate, then a light emitting polymer is deposited by spin coater and annealed on a hot plate. Low work function cathode metal is then deposited in an electroless solution and annealed on a hot plate.

DETAILED DESCRIPTION OF THE FIGURES

FIG. 2 shows a flow chart of a method of one embodiment of the invention.

FIG. 3 shows a schematic of a glass substrate with a structured anode layer.

FIG. 4 shows the schematic of a device prepared by a method of the invention.

FIG. 5 shows typical current-voltage and light output-voltage characteristics of a light emitting device.

FIG. 6 shows a double logarithmic plot of the current-voltage and light output-voltage characteristics from FIG. 5.

FIG. 7 shows a comparison between the electroluminescence spectrum (bottom curve) and the photoluminescence spectra excited using light with wavelength 370 nm and 470 nm.

FIG. 8 shows admittance results for a device created according to a method of the invention.

FIG. 9 shows stability measurements at a constant voltage of 16 V.

FIG. 10 shows a scanning electron microscopy image of an electroless deposited silver film.

FIG. 11 shows a scanning electron microscopy image of the top surface of an electrolessly deposited silver film.

DETAILED DESCRIPTION OF THE INVENTION

Figure 1:
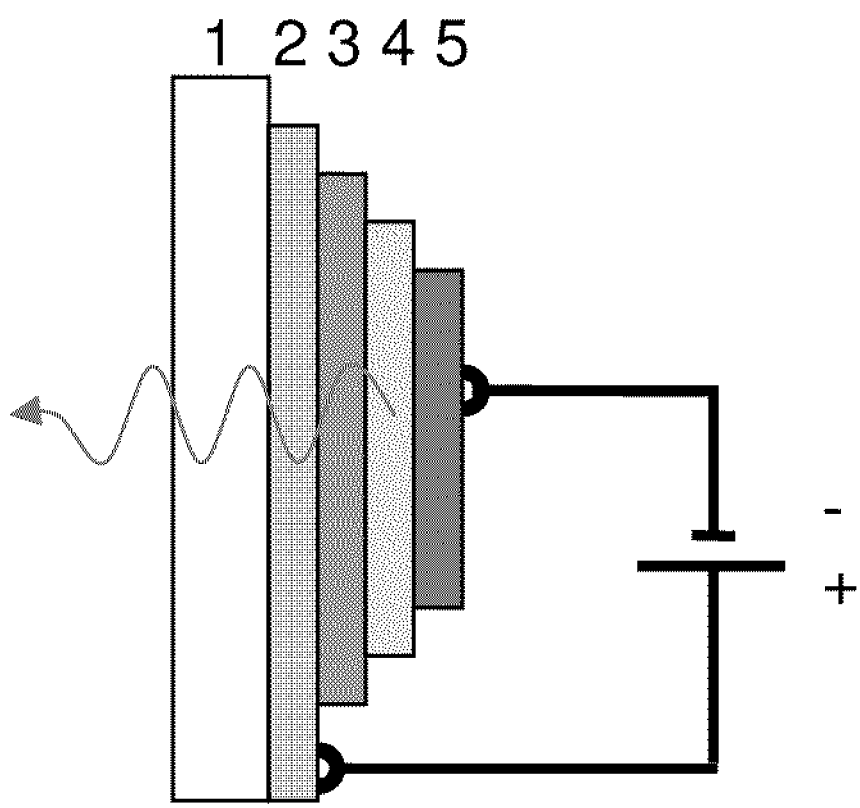
FIG. 1 shows a schematic of a typical polymer light emitting device. The layered structure consists of a carrying glass substrate (1), transparent conducting layer acting as the anode (2), hole injecting layer (3), light emitting polymer (4), and metal film acting as the cathode (5).

Embodiments of the invention provide methods for electroless deposition of a cathode layer on a solid state electronic device. There exists a huge demand for both efficient lighting and display devices. OLED devices could greatly impact this market. OLED devices provide many new revolutionary aspects that traditional display and lighting devices do not offer. Arguably the biggest problem with traditional display devices is the rigid, bulky, and heavy nature of the devices. OLED devices offer the possibility of display devices on flexible substrates, which are light weight and could be rolled up for compact storage. This would also be a great advantage for the lighting industry as it would allow for form fitting and space saving efficient lighting applications. The beneficial nature of the OLED devices is primarily due to the nanometer thickness of these devices which allow for light-weight, ultra-thin, and flexible devices.

Another benefit of a cathode deposited from solution is that the technology is applicable to similar electronic devices like polymer solar cells and thin-film transistors. The OLED devices including cathodes applied from solution could also take advantage of existing technology like inkjet technology. With proper tooling it is possible to utilize inkjet technology and "print" the solution substances in pixel-like rows and columns in dimensions suitable for high resolution display. The color of the emitted light can be varied by employing different organic compounds. Hence, it is easy to see that there is a great demand for such devices and enormous untapped potential.

Embodiments of the invention may enjoy a number of potential advantages over existing technology. For example, it would be very advantageous to prepare operational light emitting devices using cathode deposition from solution. Embodiments of the disclosed method for cathode deposition may have one or more of the following advantages:

A) Less time is needed for fabrication of a device compared to vacuum deposition; no time needed for loading and pumping of a vacuum chamber.
B) Less materials are consumed; most of the material during thermal evaporation is deposited in the rest of the chamber. The electroless plated films are more than ten times thinner than the screen printed silver paste films, hence ten times less material will be used.
C) The electroless plated films do not necessarily need post-deposition annealing, in contrast to the use of silver paste.
D) Less capital equipment is needed with less maintenance cost; a typical vacuum system is expensive and requires periodic maintenance.
E) The sensitization step offers a natural way for patterning of the metal electrodes.
F) The metal is formed during the deposition process. This is conceptually different from the deposition of a paste where the metal particles are formed in advance and the integrity of the film is maintained by the weak interaction between the particles.
G) The lack of electrodes (as in electroplating and plasma deposition) and of spatially constrained source of material (as in thermal evaporation and sputtering) allows easy scaling of the deposition process and uniform deposition on non-planar surfaces.

An overview of one embodiment of the invention is shown in FIG. 2. As shown in that figure, a typical procedure involves the steps of anode patterning and substrate cleaning, deposition of a hole injection layer, deposition of a light emitting polymer, and deposition of a cathode. Each of these steps is described in more detail below.

I. Anode Patterning and Substrate Cleaning

Typically, anodes are patterned to prevent the creation of electrical shorts. In one embodiment, a substrate is masked to pattern the anode. For example, the substrate may be indium-tin-oxide, or doped zinc oxide, or a semitransparent film of carbon nanotubes deposited on top of glass or plastic foil (e.g. poly(ethylene terephthalate), cellulose triacetate, or polyethylenenaphthenate). The substrate is masked using an adhesive protection, which may be, for example, SCOTCH® brand tape, foil, or film. More precise definition of the substrate may be accomplished by photolithography using a photoresist or by laser structuring. One potential way of defining a substrate is reported in U.S. Pat. No. 5,114,872, to Roselle, et al., which is incorporated by reference herein.

The masked substrate is then etched using an acid solution. In one embodiment the acid solution is a hydrochloric acid solution, preferably a slightly diluted hydrochloric acid solution with molarity between 5 M and 3 M. Although the length of time for the etching varies, in many applications a time of about 2 minutes is appropriate. Following the acid etching the substrate is rinsed, and the masking adhesive protection is removed.

Following removal of the masking adhesive protection the substrate is cleaned. This ensures good adhesion and proper electrical contact for the resulting structure. In one embodiment the substrate is cleaned by serial applications of deionized water with detergent, deionized water, acetone, and isopropanol. In one embodiment the substrate cleaning is performed in a sonicator. In other embodiments rinsing is mechanical, or is performed in a heated environment.

In a further embodiment the cleaned substrate is subjected to plasma treatment, which increases the reproducibility of the devices. This may be done, for example, in a vacuum system with low pressure oxygen gas discharge, or at ambient atmosphere using a corona discharge generated by a Tesla coil.

II. Deposition of Hole Injection Layer

A hole injection layer is deposited on the etched and cleaned substrate. Typically deposition is by spin coating, though methods such as ink jet printing or blade casting may also be used. The hole injection layer (HIL) is typically deposited from an aqueous dispersion of poly(3,4-ethylenedioxythiophene)poly(styrenesulfonate) (PEDOT/PSS) or of poly(thiophene-3-[2-(2-methoxyethoxy)ethoxy]-2,5-diyl).

Typically deposition occurs by covering the entire cleaned substrate with the selected HIL solution. Optionally the solution may be filtered prior to this step to improve homogeneity of the mixture. Spin coating then occurs in a brief low rpm cycle and a longer high rpm cycle. For example, spin coating may occur for 2 seconds at 300 rpm, then for 40 seconds at 1270 rpm.

The HIL is then, optionally, annealed. This accelerates the drying process and helps assist formation of the film. Annealing may occur at temperatures between 160° C. and 180° C.

III. Deposition of Light-Emitting Polymer

The selection of a light-emitting polymer will largely be determined by the needs of that the resulting structure is meant to satisfy. Suitable light-emitting polymers may include, for example, but are not limited to poly[2-methoxy-5-(2-ethylhexyl-oxy)-1,4-phenylene-vinylene (MEH-PPV), poly [2-mehtoxy-5-(3, 7-dimethyl-octyloxy)-1,4-phenylenevinylene] (MDMO-PPV), poly(9,9-dioctylfluorenyl-2,7-diyl) (PFO), and phenyl-substituted PPV.

In a preferred embodiment, the light-emitting polymer is MEH-PPV. In one process, the MEH-PPV is dissolved in toluene and tetrahydrofuran at a ratio of 0.1 g MEH-PPV:20 ml toluene:5 ml THF. The mixture is stirred overnight, then filtered prior to deposition. Rapid solvent evaporation may necessitate use of transfer pipettes. Preferably the polymer is deposited with a thickness of 90 nm. This may be accomplished, for example, by spin coating, which includes spreading the polymer solution evenly on the substrate (preferably avoiding touching the underlying film surface with the pipette), then beginning the coating. Typical conditions are spinning for 2 seconds at 300 rpm followed by 40 seconds at 1270 rpm. The spinning speed can be decreased to increase the film thickness and vice versa. The device is then annealed.

IV. Cathode Deposition

After annealing of the light-emitting polymer, the cathode is deposited. The cathode is deposited by electroless deposition from aqueous solution. A number of metals are suitable for use as cathodes, including but not limited to aluminum, calcium, silver, barium and their combinations. Silver is preferred because of the accessibility and simplicity of the reaction. Furthermore, commercial silvering kits are available from such companies as Peacock Laboratories. These kits typically include four components: Sensitizer (S), Reducer (R), Activator (A), and Silver (Ag). In the Peacock Laboratories kit (all percentages by weight), the sensitizer is a solution of propyl alcohol (20%), hydrochloric acid (5%), stannous chloride (5%), water (65-70%), and a material that Peacock maintains as a trade secret. The reducer is a solution including formaldehyde (1%) and a trade secret component (<1%). The activator is a solution of sodium hydroxide (10%) and ammonium hydroxide (5%). The silver solution is silver diamine complex (25-30%), ammonium hydroxide (10-15%) and water (55-65%).

To begin the deposition, a mask is created on top of the device structure. In a preferred embodiment this mask is created using tape, preferably SCOTCH® brand tape, however other types of adhesive foils or films are able to be used.

FIG. 4 depicts one final electrode configuration, however other geometries are also possible. To obtain the electrode configuration shown in FIG. 4, the tape has to mask the entire shaded surface in that figure.

Depending on the method of the application of the silvering solution, additional masking of the sides and opposite surface of the glass slide may be appropriate. This prevents the formation of unwanted connection between the separate device structures.

Prepare the Sensitizer (S), Reducer (R), Activator (A), and Silver (Ag) solutions from the silvering kit (Peacock Laboratories) by diluting them 1:60 with DI water. Smaller dilutions also give good results, however, the reproducibility is lower.

The sensitization step covers the polymer surface with ions that catalyze the formation of metallic silver. Surfaces not treated with the sensitizing solution remain free of silver deposits for the entire duration of the process. In a preferred embodiment the device is briefly submerged (less than 2 sec) in sensitizer, then dried. Annealing is beneficial following drying. For example, brief annealing for 2 minutes at 90° C. improves the reproducibility of the devices and reduces the appearance of electrical shorts. Care must be taken, however, as annealing for an extended period deactivates the catalyst, resulting in the deposition of little or no silver.

The actual silver deposition entails the premixing of the three remaining solutions. Typically the mixed solution starts getting cloudy in 5 minutes after which it is not useful any more; therefore, careful premixture is often observed. In one embodiment, mixture is accomplished using separate plastic pipettes, mix 1:1:1 solutions of activator, silver, and reducer. It is advisable to label all pipettes to prevent cross-contamination.

Typically one applies the solution to the polymer surface to cover the substrate. Silver will begin to deposit within several seconds. Typically the deposition occurs for about two minutes. The silver film may be slightly transparent, which indicates that it is not very thick, but it is enough for device operation. The silver film does not get consumed during prolonged operation. A preferred thickness as measured by a profilometer is between 100 nm and 150 nm.

The resulting device is rinsed with deionized water and dried. Preferably the drying is accelerated by annealing. This may be done, for example, on a hot plate for 2 minutes at 90° C. The drying improves the electrodes in the following sense.

The silver deposition results in films with stress. If the adhesion of the polymer film is not good, the stress can lift part of the polymer film and create folds. This is perceived visually as roughness. Such roughness development is often observed at the end of the silver layer formation. The drying process, as described above, substantially reduces the visual appearance for roughness. Apparently, some relaxation of the entire layered structure takes place. At this stage of the investigations, it is believed that the folds are the potential sites for development of electrical shorts. Therefore the proper final annealing of the structures contributes to the success of the manufacturing.

Removal of the mask then occurs. This should be done carefully to avoid damage to the structure. Any disruption of the continuity of the polymer film creates electrical shorts and it has to be avoided. For best results, the tape which is already in contact with the polymer film should be left intact. Leaving the tape will result in a metal electrode common for all device structures. Further structuring of the metal electrode can be done if the masking tape is done in two layers, the second layer with narrower stripes. This second layer can be removed safely lifting part of the metal electrode and thus separating the different parts of the metal electrode. This approach should result in four completely independent structures for the device shown in FIG. 4.

A complete device prepared by one embodiment of the invention is schematically represented in FIG. 4.

V. Encapsulation

The devices should be encapsulated as soon as they are dry enough from the preceding processes. A preferred way for encapsulation of the devices is using polydimethylsiloxane (PDMS). PDMS can be cured at relatively low temperature, e.g. about 65° C.

Other embodiments use two-component (pre-polymer and curing agent) source for encapsulation, Sylgard® 184 (Sylgard® is a registered trademark of Dow Corning Corp.). After mixing the two components in ratio 10/1 by weight, the mixture is deairated and applied on top of the substrate by drop casting. The solution is relatively thick but it spreads in a relatively uniform and optically transparent film over the entire surface of the substrate. This step excludes the air from the devices. In a preferred embodiment the curing is done overnight at 65° C. This type of encapsulation preserves the functionality of the devices over weeks. Encapsulation with PDMS is reported in Jpn. J. Appl. Phys. 47 (2008) pp. 8986-8988.

VI. Device Properties and Testing

Devices formed according to the methods presented herein typically emit light reproducibly, homogeneously from the entire surface, over a relatively long period of time. They may be manufactured as described above without the use of vacuum system and without an inert atmosphere glove box.

It will be understood by those skilled in the art that further advances might be made by optimizing the steps of the novel method presented herein. Moreover, it will be recognized that the use of the silver as cathode material in the above exemplary embodiments is a matter of convenience, despite that silver is not a very efficient electron injecting contact. Other substances may of course be used.

The devices typically have rectangular area, as illustrated in FIG. 4. The area is typically 2 mm by 5 mm, but it can be further varied. None of the physical quantities presented further was normalized for the area. FIG. 5 shows the current-voltage characteristics together with the light output from a typical device. Both curves are non-linear functions of the voltage, which is typical for charge injection structures. These results are the first indication for successful application of the electroless deposition.

For further analysis of these results, the same curves are represented in double logarithmic plot, in FIG. 6. The current increases over four orders of magnitude in the voltage range up to 15 V. The increase of the current as a power law of the voltage indicates that the current flows in the space charge limited regime. Such regime is typical for the current transport in organic materials where the charge carriers have low mobility.

The injection of electrical charges, positive from the anode (ITO in preferred embodiments) and negative from the cathode, in the polymer film leads to their recombination where the excess energy is emitted in form of light. Therefore the charge transport mechanisms have to be manifested also in the light output, in some cases modified by other effects. The light output curve also shows a power law dependence over three orders of magnitude. Hence, the emitted light is as result of the recombination of the injected charge carriers. Detectable level of light is emitted at voltages as low as 6V and this correlates with the onset of the second power law dependence in the current-voltage curve.

The spectral analysis of the emitted light further confirms that the emission is due to recombination of charges injected in the polymer film. FIG. 7 compares the electroluminescence spectrum with the photoluminescence spectrum, i.e. light emitted as result of excitation of the polymer using light. The figure shows use of two different wavelengths, 370 nm and 470 nm, to excite exactly the same sample on which the electroluminescence was measured. All spectra generally coincide.

Impedance spectroscopy results (FIG. 8) show that the device structure can be modeled as a capacitive structure with associated equivalent resistances. Indeed, the device structure is a polymer sandwiched between two electrodes and if no constant voltage is applied, as the case of this impedance measurement, the polymer behaves as a dielectric. The capacitance was calculated to be 4.4 nF, which is in the same range as an estimation using literature values for the dielectric constant of the polymer. The polymer is generally a dielectric, but the preparation of suitable contacts can lead to electric current even in a dielectric. The electroless deposited silver layer serves well as current injection contact.

The device structures on which the concept of electroless deposition was tested and which are presented herein are not fully optimized and any performance indicators have the potential for improvement. Nevertheless, it was interesting to test how long can the devices function. FIG. 9 shows the stability test at constant voltage. Despite of some issues, e.g. maintaining the current, this particular device was delivering significant light emission for more than 3 hours. After the test, the device was still operable, but the voltage had to be increased. Part of this lack of stability may be related to the polymer itself since similar effects were observed also for devices with thermally evaporated aluminum cathodes. Another reason can be the relatively high voltage which was needed to operate the device.

The nature of the silver layer was investigated by Scanning Electron Microscopy, FIG. 10. These studies have shown that the silver layer is very smooth on the side facing the polymer film (the top part in FIG. 10) and it is grainy on the opposite side (the bottom part in FIG. 10). The ability to form a smooth interface with the polymer is a desirable property for the device operation.

The sample images in FIG. 10 were specially prepared by washing with solvent to remove any traces from the polymer. Because the integrity of the film was broken during the washing process there were regions where the bottom part of the film flipped on the top part. This way both the part of the film facing the polymer and the opposite side of the silver film were imaged at once, as FIG. 10 shows. A more detailed image in FIG. 11 shows well-developed grain structure of the silver film. This part of the film is not in contact with the polymer, but it is not excluded that the grains can influence the operation of the devices. We have noticed that the film deposited at slightly colder temperature, e.g. around 10° C. and from less diluted solution, as described in this implementation, has smaller grain size.

VII. Further Embodiments

A comparison with analogous devices fabricated with aluminum electrode deposited by vacuum evaporation shows two substantial differences. First, the operating voltage is higher what can be expected from the different work function of silver compared to aluminum. Second, the current at low voltages (less than 2 V) is higher indicating the existence of parallel electrical paths in the devices. This suggests the directions in which this technology can be further improved.

Decreasing the polymer film thickness by simultaneously finding ways to remove the electrical shorts would improve the device performance. Substantial factors would be to better match the energy levels of the metal electrode with those of the polymer.

There are at least two strategies to achieve this. One is to choose a different metal cathode, while the other is to insert an intermediate layer. An option would be to use an interface layer of phosphonate-functionalized polyfluorene film. Another would be to use surfactant-like conjugated polymers between the light emitting polymer and the metal cathode. The use of such a layer would prevent any contact between the light emitting polymer and the electroless solution. This is expected to improve the performance of the devices. Such approach may alleviate many of the concerns of using water-based solution for the cathode deposition and can make possible the use of other metals as cathodes.

Another avenue for avoiding the possible incorporation of water in the device structure is the use of non-aqueous electroless plating. The use of solvents like methanol and ethanol will avoid in addition the problem with the wettability of the typically hydrophobic polymer. This will positively affect the metal film formation.

Electroless deposition is well established for a limited number of metals, e.g. silver, gold, platinum, palladium, copper, nickel, and for some binary, ternary, and quaternary alloys. Copper is another very promising candidate for application in the polymer light emitting devices based on the value of the work function (close to that of silver) and the well established technology.

The use of a cathode interface polymer film lowers the requirement for low work function of the metal and opens the option for use of wider range of metals as part of the cathode. The use of lower cost or possibly more environmentally friendly metals together with the inexpensive solution processes is a way to significantly lower the cost of the polymer optoelectronic devices, like light emitting devices, solar cells, and thin film transistors.

One characteristic feature of electroless deposition is the use of catalyst. This is usually tin when silver is deposited, and palladium for copper. The catalyst is thought to exist in the form of adsorbed ions stabilized in the water-based solution, rather than in metallic form. Although the applicant does not wish to be bound by theory, it is likely that the catalyst forms compounds with the deposited metal film in a very thin layer close to the interface. The work function of this compound has a critical effect on the injection properties of the contact.

The use of the proper catalyst may work in a way similar to the established approach to insert a low work function metal between the polymer and the main electrode material. One example for the case of electroless deposition of silver is the use of yttrium chloride together with the sensitizing agent tin chloride. Yttrium in metallic form has relatively low work function of 3.1 eV and could lead to improved injection at the contact.

The sensitization step offers the opportunity for structuring of the metal electrodes without masking, especially when combined with inkjet printing. The sensitizer can be precisely delivered to the spot(s) where the metal electrode has to be located. The subsequent immersion of the entire substrate in the silvering solution will result in silver deposition only on these spots. The latter process is a bulk, very cost effective process. Only minute amounts of the sensitizing agent and short exposure times are needed which makes it very suitable for inkjet printing. This will result in a very cost effective way of patterning the metal electrodes.

An alternative patterning method would be to use inkjet for deposition of agents either increasing the hydrophobicity of the polymer or completely masking these areas where the cathode deposition is unwanted. A subsequent immersion of the polymer in the water based sensitizing solution will deposit catalyst and after that a cathode metal only on the selected regions of the polymer.

The application of an embodiment of the inventive method for small electrodes pattern is expected to be even more appropriate than on large continuous areas. Stress builds in the silver film during the deposition. The release of the stress is facilitated in electrode structures with small area-to-perimeter ratio. This is a possible strategy for successful large area applications. The intentional structuring of the electrodes with feature sizes less than the visual perception will result in functional devices with less built-in stress in the metal electrodes increasing their reliability.

Patents, patent applications, publications, scientific articles, books, web sites, and other documents and materials referenced or mentioned herein are indicative of the levels of skill required for this invention. Inclusion of a document in this specification is not an admission that the document represents prior invention or is prior art for any purpose.

We claim:

1. A method for fabrication of solid state structures in aqueous solution, comprising:
    (a) masking a substrate to create a mask on the substrate;
    (b) etching the substrate;
    (c) removing the mask from the substrate;
    (d) cleaning the substrate;
    (e) depositing a hole injection layer (HIL) on the substrate;
    (f) depositing a light-emitting conjugated polymer layer on the HIL;
    (g) masking the light-emitting conjugated polymer layer; and
    (h) depositing a cathode layer on the masked light-emitting conjugated polymer layer in an aqueous electroless solution to form a solid state structure; and
    (i) encapsulating the solid state structure formed by deposition of the cathode layer.

2. The method of claim 1, including wherein step (d) is performed in a sonicator.

3. The method of claim 1, wherein step (d) includes plasma treatment of the substrate.

4. The method of claim 1, wherein said HIL is selected from the group consisting of poly(3,4-ethylenedioxythiophene) poly(styrenesulfonate) (PEDOT/PSS) and Poly(thiophene-3-[2-(2-methoxyethoxy)ethoxy]-2,5-diyl).

5. The method of claim 1, wherein said HIL is deposited by a method selected from the group consisting of ink jet printing, blade casting, spraying (including nebulizers), and spin coating.

6. The method of claim 1, wherein said light-emitting conjugated polymer is selected from the group consisting of poly [2-methoxy-5-(3, 7dimethyl -octyloxy)-1,4-phenylenevinylene] (MDMO-PPV), poly(9,9-dioctylfluorenyl-2,7-diyl) (PFO), phenyl-substituted PPV, and poly[2-methoxy-5-(2-ethylhexyl- oxy)-1,4-phenylene-vinylene (MEH-PPV).

7. The method of claim 6, wherein said light-emitting conjugated polymer layer is MEH-PPV.

8. The method of claim 1, wherein said cathode layer is selected from the group consisting of silver, gold, aluminum, calcium, platinum, palladium, copper, nickel, and combinations thereof.

9. The method of claim 1, wherein said deposition of said cathode layer is conducted in the presence of a catalyst.

10. The method of claim 9, wherein said catalyst is selected from the group consisting of tin, palladium, barium, magnesium, calcium, and yttrium.

11. The method of claim 1, wherein the electroless solution is an aqueous solution.

12. The method of claim 1, wherein said masking of the light-emitting conjugated polymer layer is conducted by inkjet printing of sensitizer.

13. The method of claim 1, wherein said film is selected from the group consisting of indium tin oxide (ITO), doped zinc oxide, and carbon nanotubes, and wherein said film is deposited on top of a foil constructed from a member of the group consisting of glass, poly(ethylene terephthalate), cellulose triacetate, and polyethylenenaphthenate.

14. A method for depositing a cathode layer on a solid state structure, comprising:
    (a) masking an ITO glass substrate that includes a hole injection layer on the substrate and a light-emitting conjugated polymer on the hole injection layer, wherein said masking creates a mask on the light-emitting conjugated polymer;
    (b) sensitizing the substrate with an ionic catalyst;
    (c) annealing the substrate;

(d) applying an aqueous cathode solution to the substrate to deposit a cathode layer on the substrate; and (e) annealing the cathode layer on the substrate.

15. The method of claim 14, wherein said light-emitting conjugated polymer is selected from the group consisting of poly [2-methoxy-5-(3,7-dimethyl-octyloxy)-1,4-phenylenevinylene] (MDMO-PPV), poly(9,9-dioctylfluorenyl-2,7-diyl) (PFO), phenyl-substituted PPV, and poly[2-methoxy-5-(2-ethylhexyl-oxy)-1,4-phenylene-vinylene (MEH-PPV).

16. The method of claim 15, wherein said light-emitting conjugated polymer layer is MEH-PPV.

17. The method of claim 14, wherein said cathode layer is selected from the group consisting of silver, gold, platinum, palladium, copper, and nickel.

18. The method of claim 14, wherein said deposition of said cathode layer is conducted in the presence of a catalyst.

19. The method of claim 18, wherein said catalyst is selected from the group consisting of tin, palladium, barium, magnesium, calcium, and yttrium.

20. The method of claim 14, wherein said masking is conducted by inkjet printing of sensitizer.

* * * * *